(12) United States Patent
Lai et al.

(10) Patent No.: US 12,336,108 B2
(45) Date of Patent: Jun. 17, 2025

(54) LEARNING METHOD FOR PLUG-IN DEPTH

(71) Applicant: Delta Electronics, Inc., Taoyuan (TW)

(72) Inventors: Jian-Jang Lai, Taoyuan (TW); Po-Yu Chen, Taoyuan (TW); Chien-Ta Lin, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 209 days.

(21) Appl. No.: 18/221,763

(22) Filed: Jul. 13, 2023

(65) Prior Publication Data

US 2024/0349471 A1   Oct. 17, 2024

(30) Foreign Application Priority Data

Apr. 17, 2023 (CN) .......................... 202310404875.7

(51) Int. Cl.
*H05K 13/08* (2006.01)
*B25J 9/16* (2006.01)
(Continued)

(52) U.S. Cl.
CPC .......... *H05K 13/0408* (2013.01); *B25J 9/163* (2013.01); *H05K 13/02* (2013.01); *H05K 13/0812* (2018.08)

(58) Field of Classification Search
CPC ............... H05K 13/0408; H05K 13/02; H05K 13/0812; H05K 13/0815; H05K 13/0413;
(Continued)

(56) References Cited

U.S. PATENT DOCUMENTS

| 2015/0054536 A1* | 2/2015 | Rackley ................. | G01R 31/70 324/750.18 |
| 2017/0000321 A1* | 1/2017 | Nakamura ............... | A61B 1/04 |

(Continued)

FOREIGN PATENT DOCUMENTS

| CN | 108575053 A | 9/2018 |
| CN | 114260903 A | 4/2022 |

(Continued)

OTHER PUBLICATIONS

CN108575053A.translate; Delta Electronics Dongguan Co Ltd; Electronic component inserting and positioning device and automatic insertionmachine. (Year: 2018).*

*Primary Examiner* — B M M Hannan
(74) *Attorney, Agent, or Firm* — KIRTON McCONKIE; Evan R. Witt

(57) ABSTRACT

The present application provides a learning method for plug-in depth including steps of: (a) utilizing a robot arm to take an electronic component with a plurality of pins; (b) utilizing a first visual device to identify a pin distance; (c) utilizing a second visual device to identify a hole distance; (d) inserting the plurality of pins into the corresponding plurality of holes with a predetermined depth according to the pin distance and the hole distance; (e) determining whether the plurality of pins are inserted into the plurality of holes, performing step (f) when the determination result is satisfied, and performing step (g) when the determination result is not satisfied; (f) recording the predetermined depth and performing the step (a) again; (g) calibrating the predetermined depth and performing the step (a) again; and (h) completing the learning of the plug-in depth after the step (f) is performed multiple times successively.

10 Claims, 9 Drawing Sheets

(51) Int. Cl.
*H05K 13/02* (2006.01)
*H05K 13/04* (2006.01)

(58) Field of Classification Search
CPC ..... H05K 13/0404; H05K 3/306; B25J 9/163; B25J 9/1687; G05B 2219/40032; G05B 2219/45029; G06T 7/73
USPC ....................................................... 700/250
See application file for complete search history.

(56) References Cited

U.S. PATENT DOCUMENTS

| | | | |
|---|---|---|---|
| 2019/0045680 A1* | 2/2019 | Kondo | H05K 13/021 |
| 2020/0103098 A1* | 4/2020 | Niki | H01S 5/0087 |
| 2022/0347848 A1* | 11/2022 | Nakayama | B25J 9/1674 |
| 2024/0024036 A1* | 1/2024 | Schipper | A61B 34/35 |

FOREIGN PATENT DOCUMENTS

| | | |
|---|---|---|
| CN | 114423175 A | 4/2022 |
| TW | I493201 B | 7/2015 |
| TW | I589199 B | 6/2017 |

\* cited by examiner

LEARNING METHOD FOR PLUG-IN DEPTH

CROSS-REFERENCE TO RELATED APPLICATION

This application claims priority to China Patent Application No. 202310404875.7, filed on Apr. 17, 2023, the entire contents of which are incorporated herein by reference for all purposes.

FIELD OF THE INVENTION

The present disclosure relates to a learning method for plug-in depth, and more particularly to a learning method for plug-in depth applicable in plug-in equipment.

BACKGROUND OF THE INVENTION

In the conventional electronic component plug-in equipment, the robot arm grips the electronic component provided by the feeder. The photographic device obtains the pin distance between the pins of the electronic component and the hole distance between the holes on the printed circuit board (PCB), so as to confirm whether the electronic component can be inserted into the PCB. If the electronic component can be inserted into the PCB, the robot arm inserts the electronic component into the PCB, thereby completing the plug-in task of the electronic component.

However, if the pins of the electronic component provided by the feeder have different lengths or are not arranged in parallel, the plug-in depth of inserting the pin into the PCB is difficult to determine. When the plug-in depth of inserting the pin into the PCB is too shallow or too deep, the pin will be deformed or broken, causing damage to the electronic component and rendering it unusable.

Therefore, there is a need of providing a learning method for plug-in depth to obviate the drawbacks encountered from the prior arts.

SUMMARY OF THE INVENTION

It is an object of the present disclosure to provide a learning method for plug-in depth. The electronic component is inserted into the substrate with a predetermined depth according to the pin distance and the hole distance, and the plug-in depth is calibrated continuously, thereby completing the learning of the plug-in depth and obtaining an ideal depth. When the pins of electronic component are inserted into the holes on the substrate with the ideal depth, the damage to the pins caused by too shallow or too deep insertion is avoided.

In accordance with an aspect of the present disclosure, there is provided a learning method for plug-in depth, applicable in a plug-in device. The plug-in device includes a platform and a robot arm connected to each other, the platform includes a feeder device and a first visual device disposed on the platform, and the robot arm includes a second visual device, the learning method includes steps of: (a) utilizing the robot arm to take an electronic component provided by the feeder device, wherein the electronic component includes a body and a plurality of pins; (b) utilizing the first visual device to identify a pin distance between the plurality of pins of the electronic component; (c) utilizing the second visual device to identify a hole distance between a plurality of holes on a substrate; (d) inserting the plurality of pins of the electronic component into the corresponding plurality of holes with a predetermined depth according to the pin distance and the hole distance; (e) determining whether the plurality of pins of the electronic component are inserted into the plurality of holes of the substrate successfully, performing a step (f) when the determination result is satisfied, and performing a step (g) when the determination result is not satisfied; (f) recording the predetermined depth and performing the step (a) again; (g) calibrating the predetermined depth and performing the step (a) again; and (h) completing the learning of the plug-in depth after the step (f) is performed multiple times successively.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
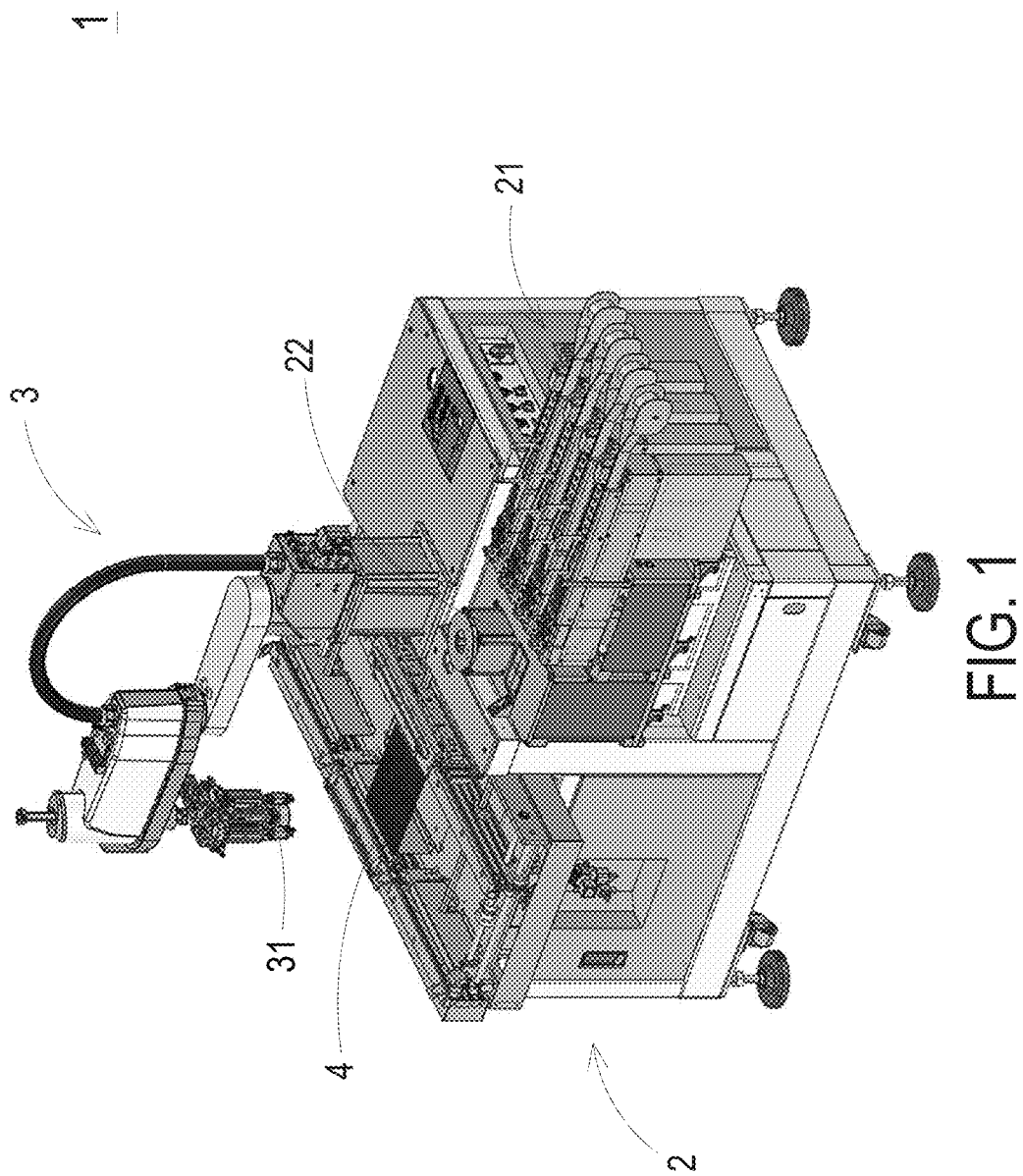
FIG. 1 is a schematic perspective view illustrating a plug-in device according to an embodiment of the present disclosure.
Figure 2:
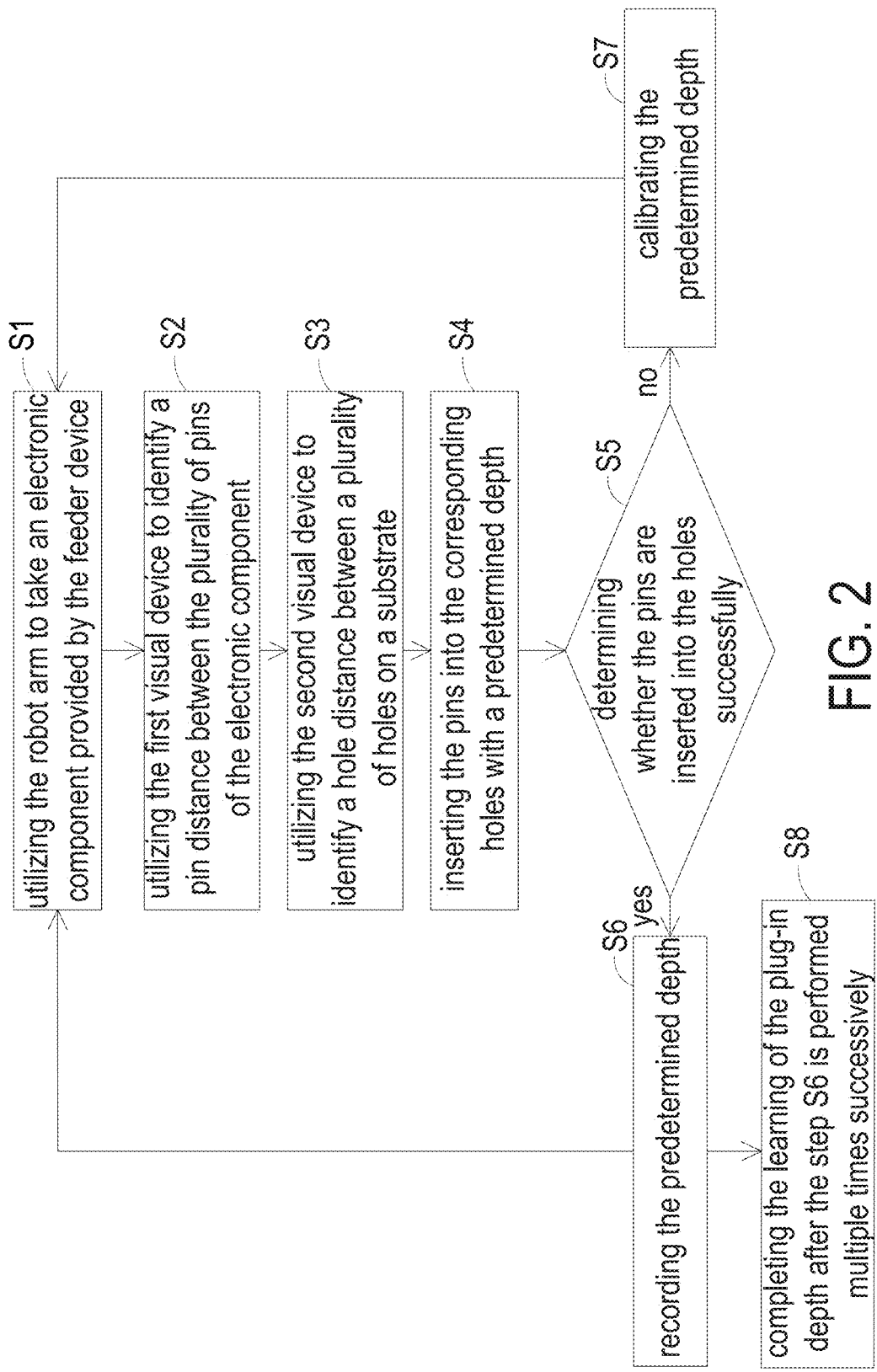
FIG. 2 is a schematic flow chart illustrating a learning method for plug-in depth according to an embodiment of the present disclosure.
Figure 3B:
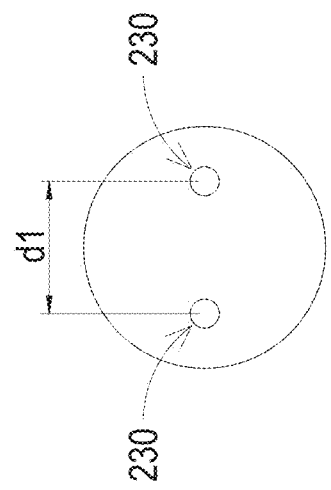
FIG. 3B is a bottom view of the electronic component of FIG. 3A.
Figure 3A:
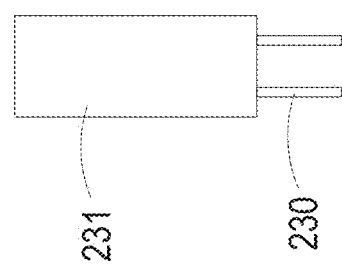
FIG. 3A is a schematic view illustrating an electronic component provided by the feeder device of FIG. 1.
Figure 4:
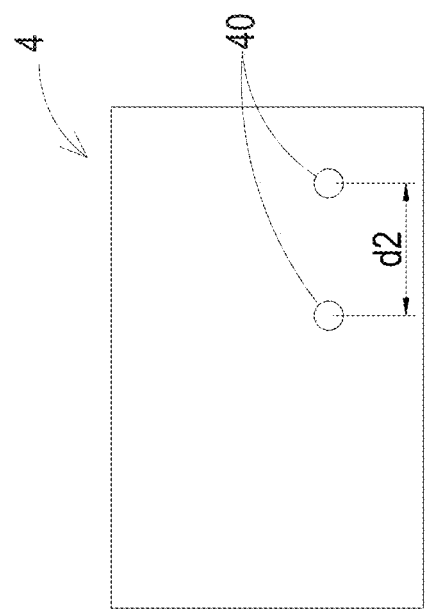
FIG. 4 is a top view of the substrate of FIG. 1.
Figure 5:
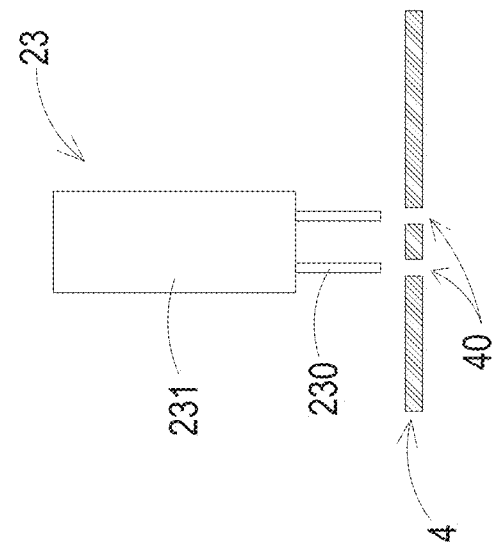
FIG. 5 is a schematic side view illustrating the electronic component going to be inserted into the substrate.

FIG. 1 is a schematic perspective view illustrating a plug-in device 1 according to an embodiment of the present disclosure. FIG. 2 is a schematic flow chart illustrating a learning method for plug-in depth according to an embodiment of the present disclosure. FIG. 3A is a schematic view illustrating an electronic component 23 provided by the feeder device 21 of FIG. 1. FIG. 3B is a bottom view of the electronic component 23 of FIG. 3A. FIG. 4 is a top view of the substrate 4 of FIG. 1. FIG. 5 is a side schematic side view illustrating the electronic component 23 going to be inserted into the substrate 4. The learning method for plug-in depth shown in FIG. 2 is applicable for the plug-in device 1 shown in FIG. 1. As shown in FIGS. 1, 2, 3A, 3B, 4 and 5, the plug-in device 1 includes a platform 2 and a robot arm 3 connected to each other. The platform 2 includes a feeder device 21 and a first visual device 22 disposed on the platform 2, and the robot arm 3 includes a second visual device 31. The first visual device 22 and the second visual device 31 are for example but not limited to video recording equipments. The learning method for the plug-in depth includes steps S1, S2, S3, S4, S5, S6, S7 and S8. In the step S1, the robot arm 3 is utilized to take an electronic component 23 provided by the feeder device 21, and the electronic component 23 includes a body 231 and a plurality of pins 230. In the step S2, the first visual device 22 is utilized to identify a pin distance d1 between the plurality of pins 230 of the electronic component 23. In an embodiment, the first visual device 22 shoots a picture including a plurality of pins 230 and utilizes the picture to identify the pin distance d1 between the plurality of pins 230. In the step S3, the second visual device 31 is utilized to identify a hole distance d2 between a plurality of holes 40 on a substrate 4. The substrate 4 is for example but not limited to a PCB. In an embodiment, the second visual device 31 shoots a picture including a plurality of holes 40 and utilizes the picture to identify the hole distance d2 between the plurality of holes 40. In the step S4, the plurality of pins 230 of the electronic component 23 are inserted into the corresponding plurality of holes 230 with a predetermined depth dx according to the pin distance d1 and the hole distance d2. In an embodiment, the predetermined depth dx is 1 mm. In the step S5, it is determined whether the plurality of pins 230 of the electronic component 23 are inserted into the plurality of holes 40 of the substrate 4 successfully. When the determination result of the step S5 is satisfied, the step S6 is performed to record the predetermined depth dx, and then the step S1 is performed again. When the determination result of the step S5 is not satisfied, the step S7 is performed to calibrate the predetermined depth dx, and then the step S1 is performed again. In an embodiment, the calibration manner of the predetermined depth dx is to calibrate the predetermined depth dx to dx+Δd, wherein the Δd is a calibration depth. After the step S6 is performed multiple times successively, the learning of the plug-in depth is completed, and the predetermined depth dx is regarded as an ideal depth (step S8). In an embodiment, the learning of the plug-in depth is completed after the step S6 is performed for 3~10 times successively.

In the learning method for plug-in depth of the present disclosure, the electronic component 23 is inserted into the substrate 4 with a predetermined depth dx according to the pin distance d1 and the hole distance d2, and the plug-in depth is calibrated continuously, thereby completing the learning of the plug-in depth and obtaining an ideal depth. When the pins 230 of the electronic component 23 are inserted into the holes 40 on the substrate 4 with the ideal depth, the damage to the pins 230 caused by too shallow or too deep insertion is avoided.

Figure 6:
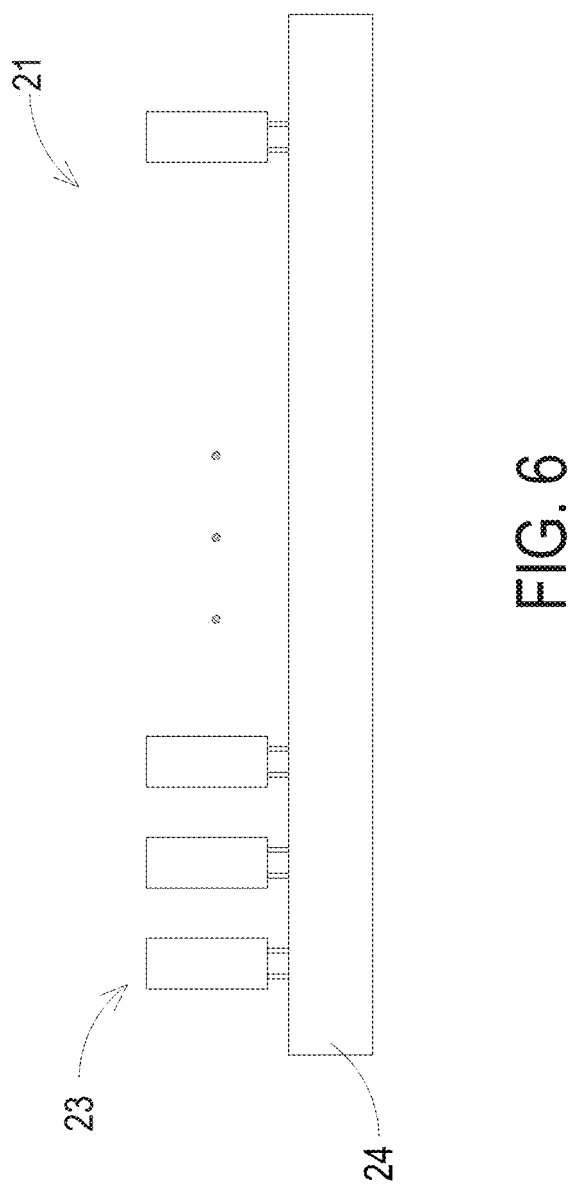
FIG. 6 is a schematic view illustrating the feeder device of FIG. 1 as a vertical feeder device.
Figure 7A:
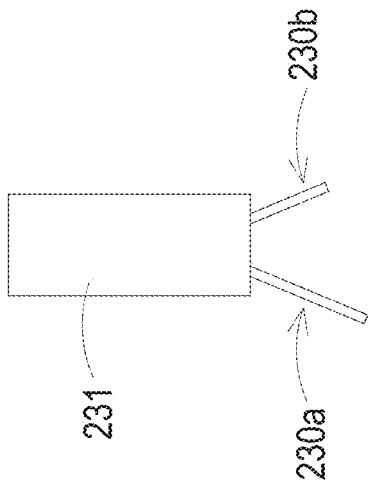
FIG. 7A is a schematic view illustrating the electronic component of FIG. 6 after cutting.

In an embodiment, the feeder device 21 is a vertical feeder device. As shown in FIG. 6, in this embodiment, the vertical feeder device has a feeding strip 24, a plurality of electronic components 23 are disposed on the feeding strip 24. When the cutting knife (not shown) cuts the plurality of electronic components 23 from the vertical feeder device, the pins 230 are expanded due to the stress relief phenomenon caused by detaching from the feeding strip 24. The expansion phenomenon of the pins 230 after cutting the electronic component 23 is exemplified in FIG. 7A. Please refer to FIG. 7A, when the pins 230 are expanded, the pins 230 cannot be inserted into the corresponding plurality of holes 40 because the pin distance d1 of the pins 230 is greater than the hole distance d2. In an embodiment, the pins 230 are adjusted by the following adjustment ways for allowing the electronic component 23 to be inserted into the substrate 4.

Figure 7B:
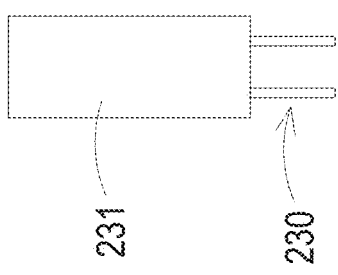
FIG. 7B is a schematic view illustrating the electronic component in FIG. 7A after being adjusted in a first adjustment way.
Figure 7C:
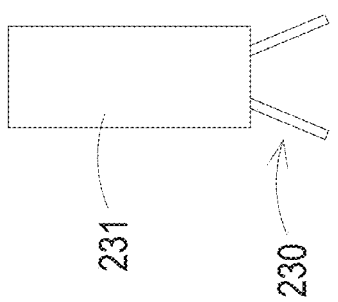
FIG. 7C is a schematic view illustrating the electronic component in FIG. 7A after being adjusted in a second adjustment way.

The first adjustment way is to perform a shape correction to the plurality of pins 230 for making the plurality of pins 230 parallel to each other, as shown in FIG. 7B. The second adjustment way is to cut the plurality of pins 230 into a first pin 230a and a second pin 230b with different lengths, as shown in FIG. 7C. After the adjustment is completed, the pins 230 of the electronic components 23 shown in FIGS. 7B and 7C can be inserted into the corresponding holes 40 through the embodiments shown in FIGS. 8 and 9 respectively.

Figures 8, 9:
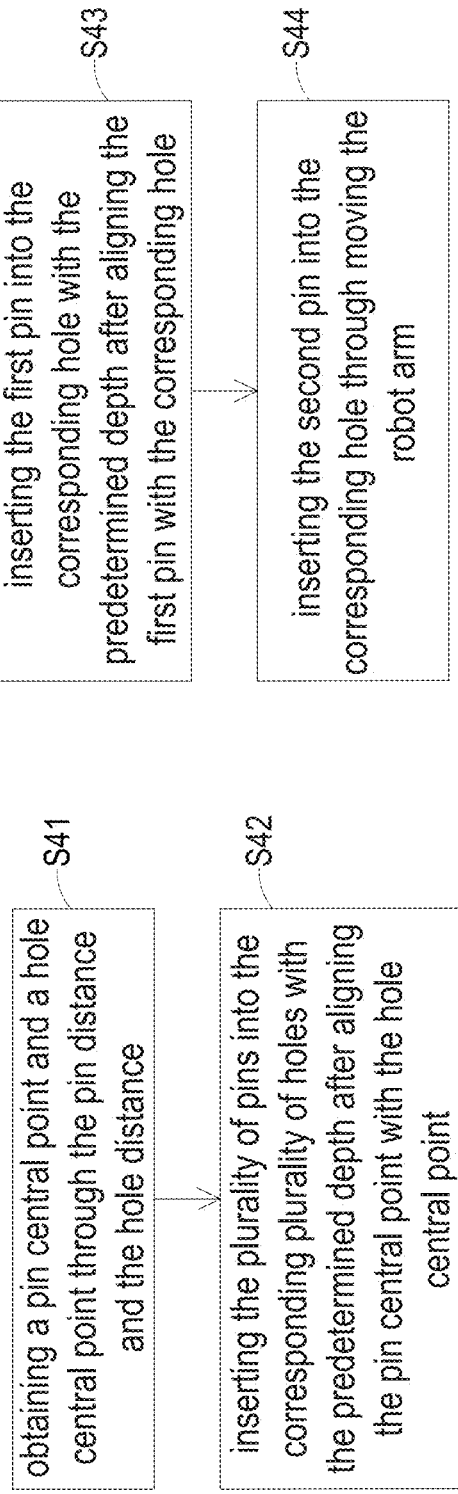
FIG. 8 is a schematic flow chart illustrating an implementation of the step S4 of FIG. 2.
FIG. 9 is a schematic flow chart illustrating another implementation of the step S4 of FIG. 2.

Please refer to FIGS. 2, 7B and 8. FIG. 8 is a schematic flow chart illustrating an implementation of step S4 of FIG. 2. The step S4 of FIG. 8 is applicable for the electronic component 23 shown in FIG. 7B. In the learning method of this embodiment, the step S4 further includes steps S41 and steps S42. In the step S41, a pin central point and a hole central point are obtained through the pin distance d1 and the hole distance d2. In the step S42, the plurality of pins 230 are inserted into the corresponding plurality of holes 40 with the predetermined depth dx after aligning the pin central point with the hole central point.

Please refer to FIGS. 2, 7C and 9. FIG. 9 is a schematic flow chart illustrating another implementation of the step S4 of FIG. 2. The step S4 of FIG. 9 is applicable for the electronic component 23 shown in FIG. 7C. In this embodiment, the plurality of pins 230 are cut into a first pin 230a and a second pin 230b. The length of the first pin 230a is longer than the length of the second pin 230b. In the learning method of this embodiment, the step S4 further includes steps S43 and S44. In the step S43, the first pin 230a is inserted into the corresponding hole 40 with a predetermined depth dx after aligning the first pin 230a with the corresponding hole 40. In the step S44, the second pin 230b is inserted into the corresponding hole 40 through moving the robot arm 3. In an embodiment, the second pin 230b is aligned to the corresponding hole 40 through moving the robot arm 3 in a direction parallel to the PCB.

Figure 10:
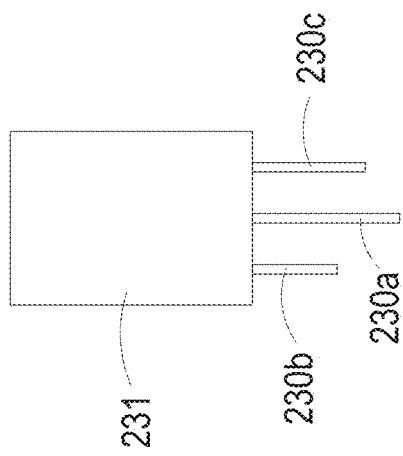
FIG. 10 is a schematic view illustrating the electronic component with three pins.
Figure 11:
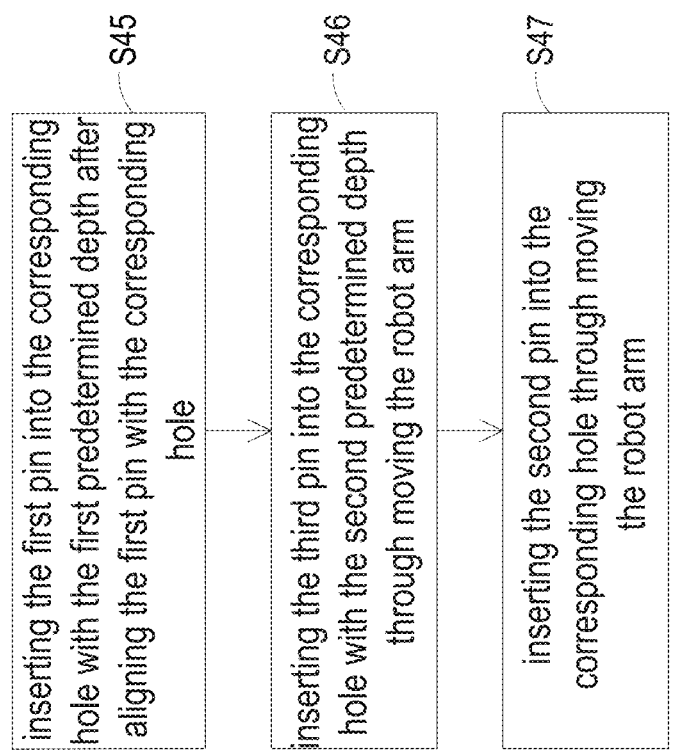
FIG. 11 is a schematic flow chart illustrating another implementation of the step S4 of FIG. 2.

In an embodiment, the amount of the pins 230 is not limited to two (shown in the above embodiments). The implementation of the amount of the pins 230 equaling three is exemplified as follow. Please refer to FIGS. 2, 10 and 11. FIG. 10 is a schematic view illustrating the electronic component with three pins. FIG. 11 is a schematic flow chart illustrating another implementation of the step S4 of FIG. 2, the step S4 shown in FIG. 11 is applicable for the electronic component 23 shown in FIG. 10. In this embodiment, the plurality of pins 230 includes a first pin 203a, a second pin 230b and a third pin 230c, the length of the first pin 230a is longer than the length of the third pin 230c, and the length of the third pin 230c is longer than the length of the second pin 230. In the learning method for the plug-in depth of this embodiment, the step S4 further includes steps S45, S46 and S47. In this embodiment, the predetermined depth dx includes a first predetermined depth dx1 and a second predetermined depth dx2. In the step S45, the first pin 230a is inserted into the corresponding hole 40 with the first predetermined depth dx1 after aligning the first pin 230a with the corresponding hole 40. In the step S46, the third pin 230c is inserted into the corresponding hole 40 with the second predetermined depth dx2 through moving the robot arm 3. The first predetermined depth dx1 and second predetermined depth dx2 may be the same or different predetermined depth. In addition, when the electronic component 23 has N pins with different lengths, N-1 predetermined depths needs to be designed. In an embodiment, the third pin 230c is aligned to the corresponding hole 40 through moving the robot arm 3 in a direction parallel to the PCB. In the step S47, the second pin 230b is inserted into the corresponding hole 40 through moving the robot arm 3. In an embodiment, the second pin 230b is aligned to the corresponding hole 40 through moving the robot arm 3 in a direction parallel to the PCB.

From the above descriptions, the present disclosure provides a learning method for plug-in depth. The electronic component is inserted into the substrate with a predetermined depth according to the pin distance and the hole distance, and the plug-in depth is calibrated continuously, thereby completing the learning of the plug-in depth and obtaining an ideal depth. When the pins of electronic component are inserted into the holes on the substrate with the ideal depth, the damage to the pins caused by too shallow or too deep insertion is avoided.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A learning method for plug-in depth, applicable in a plug-in device, wherein the plug-in device comprises a platform and a robot arm connected to each other, the platform comprises a feeder device and a first visual device disposed on the platform, and the robot arm comprises a second visual device, the learning method comprising steps of:
   (a) utilizing the robot arm to take an electronic component provided by the feeder device, wherein the electronic component comprises a body and a plurality of pins;
   (b) utilizing the first visual device to identify a pin distance between the plurality of pins of the electronic component;
   (c) utilizing the second visual device to identify a hole distance between a plurality of holes on a substrate;
   (d) inserting the plurality of pins of the electronic component into the corresponding plurality of holes with a predetermined depth according to the pin distance and the hole distance;
   (e) determining whether the plurality of pins of the electronic component are inserted into the plurality of holes of the substrate successfully, performing a step (f) when the determination result is satisfied, and performing a step (g) when the determination result is not satisfied;
   (f) recording the predetermined depth and performing the step (a) again;
   (g) calibrating the predetermined depth and performing the step (a) again; and
   (h) completing the learning of the plug-in depth after the step (f) is performed multiple times successively.

2. The learning method according to claim 1, wherein in the step (g), the calibration manner of the predetermined depth is to add a calibration depth to the predetermined depth.

3. The learning method according to claim 1, wherein the step (h), the learning of the plug-in depth is completed after the step (f) is performed for 3~10 times continuously.

4. The learning method according to claim 1, wherein the first visual device and the second visual device are video recording equipments.

5. The learning method according to claim 1, wherein the feeder device is a vertical feeder device.

6. The learning method according to claim 1, wherein the step (d) further comprises steps of:
   (d1) obtaining a pin central point and a hole central point through the pin distance and the hole distance; and
   (d2) inserting the plurality of pins into the corresponding plurality of holes with the predetermined depth after aligning the pin central point with the hole central point.

7. The learning method according to claim 1, wherein the plurality of pins comprises a first pin and a second pin with different length, and the length of the first pin is longer that the length of the second pin, wherein the step (d) further comprises steps of:
   (d3) inserting the first pin into the corresponding hole with the predetermined depth after aligning the first pin with the corresponding hole; and
   (d4) inserting the second pin into the corresponding hole through moving the robot arm.

8. The learning method according to claim 1, wherein the plurality of pins comprises a first pin, a second pin and a third pin with different length, the length of the first pin is longer than the length of the third pin, and the length of the third pin is longer than the length of the second pin, the predetermined depth comprises a first predetermined depth and a second predetermined depth, wherein the step (d) further comprises steps of:
   (d5) inserting the first pin into the corresponding hole with the first predetermined depth after aligning the first pin with the corresponding hole;
   (d6) inserting the third pin into the corresponding hole with the second predetermined depth through moving the robot arm; and
   (d7) inserting the second pin into the corresponding hole through moving the robot arm.

9. The learning method according to claim 1, wherein the predetermined depth is 1 mm.

10. The learning method according to claim 1, wherein the substrate is a PCB.

* * * * *